(12) United States Patent
Konoma

(10) Patent No.: US 9,406,862 B2
(45) Date of Patent: Aug. 2, 2016

(54) ELASTIC WAVE DEVICE INCLUDING MULTILAYER METAL FILM

(71) Applicant: Murata Manufacturing Co., Ltd., Nagaokakyo-shi, Kyoto-fu (JP)

(72) Inventor: Chihiro Konoma, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 14/510,226

(22) Filed: Oct. 9, 2014

(65) Prior Publication Data

US 2015/0115771 A1 Apr. 30, 2015

(30) Foreign Application Priority Data

Oct. 30, 2013 (JP) ................... 2013-225335

(51) Int. Cl.
*H01L 41/047* (2006.01)
*C23C 14/34* (2006.01)
*C30B 29/52* (2006.01)
*C30B 25/18* (2006.01)
*C30B 25/02* (2006.01)
*C30B 23/02* (2006.01)
*H03H 9/02* (2006.01)
(Continued)

(52) U.S. Cl.
CPC .......... *H01L 41/0477* (2013.01); *C30B 23/025* (2013.01); *C30B 29/02* (2013.01); *C30B 29/52* (2013.01); *H03H 9/02992* (2013.01); *H03H 9/14573* (2013.01); *C30B 25/183* (2013.01)

(58) Field of Classification Search
CPC ...... H01L 41/09; H01L 41/047; H03H 9/145; H03H 3/08; H03H 9/25; H03H 9/647; C30B 25/183; C30B 23/025; C30B 29/52; C30B 32/02; C30B 25/18; C23C 14/34
USPC .............. 257/758, 701, 738; 310/313 R, 364; 117/105, 106; 204/192.1
See application file for complete search history.

(56) References Cited

U.S. PATENT DOCUMENTS 6,316,860 B1 11/2001 Kimura et al.
7,730,596 B2 * 6/2010 Kadota .............. H03H 9/02559 29/25.35
(Continued)

FOREIGN PATENT DOCUMENTS

JP 8-340233 A 12/1996
JP 2002-305425 A 10/2002
(Continued)

OTHER PUBLICATIONS

Official Communication issued in corresponding Japanese Patent Application No. 2013-225335, mailed on Sep. 1, 2015.

*Primary Examiner* — Alexander Oscar Williams
(74) *Attorney, Agent, or Firm* — Keating & Bennett, LLP

(57) ABSTRACT

An elastic wave device includes a piezoelectric substrate including a primary surface and a first electrode which is provided on the primary surface of the piezoelectric substrate, which includes a first multilayer metal film including at least three metal films laminated in a bottom-to-top direction, and which includes at least an IDT film. The first multilayer metal film includes a Ti film as the topmost film and has a crystal orientation oriented in a predetermined direction so that the normal line direction of the plane of a Ti crystal of the Ti film coincides with the Z axis of a crystal of a piezoelectric body defining the piezoelectric substrate.

8 Claims, 6 Drawing Sheets

(51) Int. Cl.
*H03H 9/145* (2006.01)
*C30B 29/02* (2006.01)

(56) References Cited

U.S. PATENT DOCUMENTS

| | | | |
|---|---|---|---|
| 2002/0008437 A1 | 1/2002 | Inoue et al. | |
| 2009/0243430 A1* | 10/2009 | Yokota | H03H 9/14541 310/313 B |
| 2010/0117483 A1* | 5/2010 | Tanaka | H03H 3/08 310/313 B |
| 2010/0244625 A1* | 9/2010 | Fukano | H03H 9/059 310/313 B |
| 2011/0043075 A1* | 2/2011 | Okumichi | H03H 9/02763 310/313 B |
| 2011/0102108 A1 | 5/2011 | Fukuda | |
| 2012/0139652 A1* | 6/2012 | Yamanaka | H03H 9/02661 331/158 |
| 2013/0099628 A1* | 4/2013 | Inoue | H01L 23/315 310/313 R |
| 2013/0234558 A1* | 9/2013 | Tsuda | H01L 41/0477 310/313 B |
| 2014/0361663 A1* | 12/2014 | Oikawa | H03H 9/1064 310/344 |
| 2015/0069882 A1* | 3/2015 | Umeda | H03H 9/02574 310/313 B |
| 2015/0102705 A1* | 4/2015 | Iwamoto | H03H 9/0222 310/313 B |
| 2015/0249438 A1* | 9/2015 | Hira | H03H 9/059 310/313 C |
| 2015/0287905 A1* | 10/2015 | Umeda | C23C 14/0641 310/313 R |

FOREIGN PATENT DOCUMENTS

| | | |
|---|---|---|
| JP | 2004-56355 A | 2/2004 |
| JP | 2010-81086 A | 4/2010 |
| JP | 5131117 B2 | 1/2013 |
| WO | 99/16168 A1 | 4/1999 |
| WO | 2009/150786 A1 | 12/2009 |

* cited by examiner

ELASTIC WAVE DEVICE INCLUDING MULTILAYER METAL FILM

BACKGROUND OF THE INVENTION

1. Field of the Invention

The present invention relates to an elastic wave device used for a resonator, a band-pass filter, or the like and to a method for manufacturing the elastic wave device. In more particular, the present invention relates to an elastic wave device in which a first multilayer metal film and a second multilayer metal film are formed on a piezoelectric substrate and to a method for manufacturing the elastic wave device.

2. Description of the Related Art

In a conventional device, with the reduction in size of a mobile phone or the like, the reduction in size of a band-pass filter used therefor is also required. As this type of band-pass filter, an elastic wave device using an elastic wave, such as a surface acoustic wave, has been widely used.

Japanese Patent No. 5131117 discloses one example of the elastic wave device. In the elastic wave device disclosed in Japanese Patent No. 5131117, on a LiTaO$_3$ substrate 100, a second electrode 121 is laminated so as to be overlapped with a part of a first electrode 111 including an IDT electrode. The first electrode 111 and the second electrode 121 are each formed of a multilayer metal film. In the first electrode 111, a Pt film 113, a Ti film 114, and an AlCu film 115 are laminated in this order on a NiCr film 112, and on the AlCu film 115, a Ti film 116 is laminated. The bottommost film of the multilayer metal film forming the second electrode 121 is formed of a Ti film 122.

Japanese Patent No. 5131117 discloses that since the Ti film of the first electrode and the Ti film of the second electrode are in contact with each other, the contact resistance therebetween can be decreased.

In addition, according to a surface acoustic wave device disclosed in International Publication No. WO 09/150786, an electrode is formed of a multilayer metal film including an AlCu epitaxial film and a Ti film laminated thereon. In this surface acoustic wave device, it has been disclosed that since hillocks of Cu are generated when the multilayer metal film as described above is exposed to a high temperature, a low temperature treatment is necessarily performed.

With the reduction in size of the elastic wave device, improvement in electric power handling capability thereof has been strongly required. According to the elastic wave device disclosed in Japanese Patent No. 5131117, although the contact resistance described above could be decreased, the electric power handling capability was not sufficient.

In addition, although International Publication No. WO 09/150786 has disclosed the surface acoustic wave device using the multilayer metal film including an AlCu epitaxial film, the contact resistance and the electric power handling capability of the structure in which multilayer metal films are laminated to each other have not been discussed.

SUMMARY OF THE INVENTION

Accordingly, preferred embodiments of the present invention provide an elastic wave device having an electrode multilayer structure which is excellent in electric power handling capability and which has a low contact resistance between first and second electrodes and a method for manufacturing the elastic wave device described above.

According to a preferred embodiment of the present invention, an elastic wave device includes a piezoelectric substrate including a primary surface, and a first electrode which is provided on the primary surface of the piezoelectric substrate, which includes a first multilayer metal film including at least three metal films laminated in a bottom-to-top direction, and which includes at least an IDT electrode. In this elastic wave device, the first multilayer metal film includes a Ti film defining a topmost film and has a crystal orientation oriented in a predetermined direction so that the normal line direction of the (001) plane of a Ti crystal of the Ti film coincides with the Z axis of a crystal of a piezoelectric body defining the piezoelectric substrate.

The elastic wave device according to one specific aspect of various preferred embodiments of the present invention further includes a second electrode which is provided above the primary surface of the piezoelectric substrate and which is includes a second multilayer metal film including at least two metal films laminated in a bottom-to-top direction. In the elastic wave device described above, a contact portion at which the first electrode and the second electrode are electrically connected to each other is defined by a portion at which the bottommost metal film of the second multilayer metal film is overlapped with the topmost metal film of the first multilayer metal film, the first multilayer metal film includes an epitaxial film and the Ti film as the topmost film, and the second multilayer metal film includes a Ti film as the bottommost film.

In the elastic wave device according to another specific aspect of various preferred embodiments of the present invention, the topmost Ti film of the first multilayer metal film is an epitaxial film.

In the elastic wave device according to another specific aspect of various preferred embodiments of the present invention, the bottommost Ti film of the second multilayer metal film is a polycrystalline film, the second multilayer metal film further includes an Al film provided on the bottommost Ti film, and the epitaxial Ti film which is the topmost film of the first multilayer metal film and the polycrystalline Ti film which is the bottommost film of the second multilayer metal film define an interlayer Ti—Ti junction layer.

In the elastic wave device according to another specific aspect of various preferred embodiments of the present invention, the epitaxial film is made of one material selected from the group consisting of Al, AlCu, and Pt. In particular, the epitaxial film is preferably made of AlCu.

In the elastic wave device according to another specific aspect of various preferred embodiments of the present invention, a thickness of the topmost Ti film of the first multilayer metal film preferably is approximately 30 Å or more, for example.

According to another preferred embodiment of the present invention, there is provided a method for manufacturing an elastic wave device, which includes laminating metal films on a piezoelectric substrate to form a first multilayer metal film functioning as a first electrode, and laminating metal films to form a second multilayer metal film so as to include a portion which overlaps the first multilayer metal film. In the manufacturing method described above, when the first multilayer metal film is formed, an epitaxial film is formed, and a Ti film is formed as the topmost film, and when the second multilayer metal film is formed, a Ti film is formed as the bottommost film.

In the method for manufacturing an elastic wave device according to another specific aspect of various preferred embodiments of the present invention, the first multilayer metal film defining the first electrode is formed at a temperature of approximately 300° C. or less, and the second multilayer metal film is formed at a temperature of approximately 300° C. or less. In the manufacturing method described above, when the first multilayer metal film is formed, the epitaxial film preferably is formed of AlCu.

In the elastic wave device and the manufacturing method thereof according to various preferred embodiments of the present invention, since the first electrode includes an AlCu epitaxial film, in the first electrode including the IDT electrode, the electric power handling capability is significantly increased. Furthermore, since the first multilayer metal film has a crystal orientation oriented in a predetermined direction at the contact portion so that the normal line direction of the (001) plane of the Ti crystal of the topmost Ti film of the first multilayer metal film coincides with the Z axis of the crystal of the piezoelectric body defining the piezoelectric substrate, the contact resistance is effectively decreased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, with reference to the drawings, the present invention will be described with reference to particular preferred embodiments.

Figure 2:
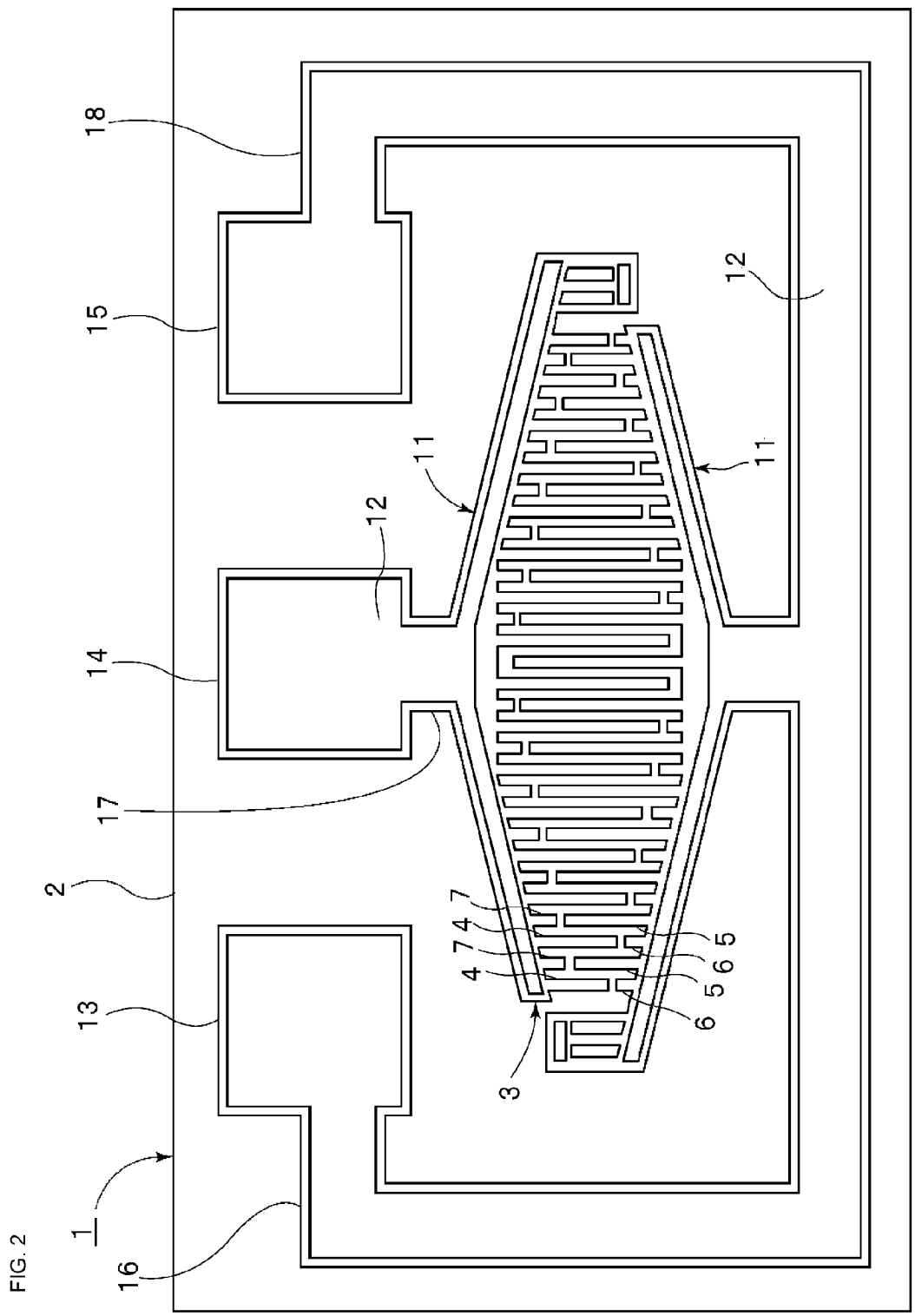
FIG. 2 is a schematic plan view of the elastic wave device according to a preferred embodiment of the present invention.

FIG. 2 is a plan view showing a surface acoustic wave device as an elastic wave device according to a preferred embodiment of the present invention.

A surface acoustic wave device 1 includes a piezoelectric substrate 2. As the piezoelectric substrate 2, a substrate formed from a piezoelectric single crystal, such as $LiTaO_3$ or $LiNbO_3$, or a piezoelectric ceramic preferably is used. In this preferred embodiment, the piezoelectric substrate 2 preferably is formed from $LiTaO_3$.

On the piezoelectric substrate 2, an IDT electrode 3 is provided. The IDT electrode 3 includes a plurality of first electrode fingers 4 and a plurality of second electrode fingers 5. The first electrode fingers 4 and the second electrode fingers 5 are alternately interposed with each other. In addition, first dummy electrodes 6 are arranged so as to face front ends of the first electrode fingers 4 in a direction in which the electrode fingers extend. Second dummy electrodes 7 are arranged so as to face front ends of the second electrode fingers 5 in a direction in which the electrode fingers extend.

Base ends of the first electrode fingers 4 and the second dummy electrodes 7 are connected to one bus bar. In addition, base ends of the second electrode fingers 5 and the first dummy electrodes 6 are connected to the other bus bar.

In this preferred embodiment, on the piezoelectric substrate 2, a first electrode 11 including the IDT electrode 3 is provided. This first electrode 11 also includes wire patterns 16 to 18 and electrode pads 13 to 15, each of which is electrically connected to the IDT electrode 3. Furthermore, a second electrode 12 is laminated so as to overlap a portion of the first electrode 11.

The second electrode 12 is laminated on the bus bars, the wire patterns 16 to 18, and the electrode pads 13 to 15, which are included in the first electrode 11.

The first electrode 11 includes a first multilayer metal film, and the second electrode 12 includes a second multilayer metal film.

Figure 1:
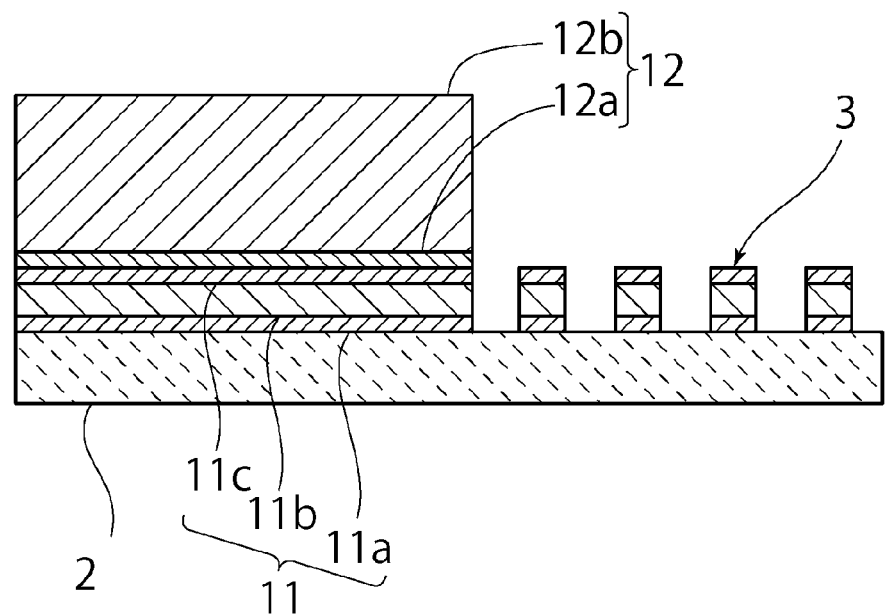
FIG. 1 is a partial front cross-sectional view showing an important portion of an elastic wave device according to a preferred embodiment of the present invention.

As shown in FIG. 1, in this preferred embodiment, the first electrode 11 preferably has a structure in which a Ti film 11a, an AlCu epitaxial film 11b, and a Ti film 11c are laminated in this order from the bottom. In the first electrode 11, the AlCu epitaxial film 11b preferably contains approximately 0.2 percent by weight or more of Cu, for example.

The Ti film 11c is laminated on the AlCu epitaxial film 11b and is an epitaxial film in this preferred embodiment. However, the Ti film 11c is not always required to be an epitaxial film.

The second electrode 12 has a structure in which a Ti film 12a and an AlCu film 12b are laminated in this order from the bottom. As apparent in FIG. 1, at electrode finger portions of the IDT electrode 3, the electrode fingers of the IDT electrode 3 preferably are made only from the first multilayer metal film.

In the first electrode 11 of the surface acoustic wave device 1 of this preferred embodiment, since the AlCu epitaxial film 11b is an epitaxial film, the electric power handling capability is effectively increased. That is, with the reduction in size of the surface acoustic wave device 1, a heat dissipation performance is degraded. Hence, the electric power handling capability may be degraded in some cases.

However, in this preferred embodiment, the AlCu epitaxial film 11b is used and increases the electric power handling capability to approximately $10^3$ times or more as compared to that of a polycrystalline AlCu film. Hence, the electric power handling capability is significantly increased. In addition, the Ti film 12a of the second electrode 12 is laminated on the topmost Ti film 11c of the first electrode 11 to define a contact portion. Accordingly, the contact resistance is also effectively decreased.

Hence, according to this preferred embodiment, the improvement in electric power handling capability and the decrease in contact resistance are both achieved.

The content of Cu in the AlCu epitaxial film 11b is preferably approximately 0.2 percent by weight or more, for example. With this Cu content, the electric power handling capability is further increased. In addition, when the Cu content is excessively high, the formation of the epitaxial film may become difficult in some cases. Hence, the Cu content is preferably approximately 10 percent by weight or less, for example.

According to Japanese Patent No. 5131117, the AlCu film is formed on the NiCr film provided on the piezoelectric substrate. Since the structure of the NiCr film is amorphous, the AlCu film disclosed in Japanese Patent No. 5131117 cannot be an epitaxial film. In particular, the normal line direction of the (111) plane of the Al crystal of the AlCu film laminated on the NiCr film, which is an amorphous film, provided on the piezoelectric substrate and the normal line direction of the (001) plane of the Ti Crystal of the Ti film as the topmost film cannot coincide with the Z axis direction of the crystal of the piezoelectric body. Hence, as described above, according to Japanese Patent No. 5131117, the electric power handling capability cannot be increased unlike the case of this preferred embodiment.

In addition, although the upper limit of the thickness of the Ti film is not particularly limited, in consideration of a manufacturing method and the like, the upper limit preferably is approximately 40 nm, for example.

Figure 3:
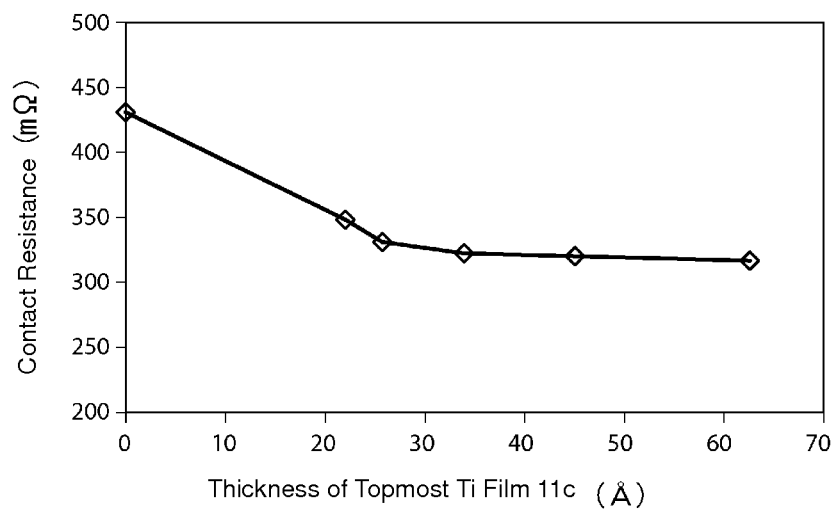
FIG. 3 is a graph showing the relationship between a contact resistance at a contact portion and the thickness of a topmost Ti film at the contact portion according to a preferred embodiment of the present invention.

FIG. 3 is a graph showing the relationship between a contact resistance and the thickness of the Ti film 11c defining the topmost film. This contact resistance indicates a resistance in a region of a contact portion having an area of approximately 20 μm×20 μm, for example. As apparent from FIG. 3, it was discovered that as the thickness of the topmost Ti film 11c is increased, the contact resistance is decreased. In particular, it was discovered that when the thickness of the Ti film 11c is increased to approximately 30 Å or more, the contact resistance is decreased to an approximately constant value. Hence, since the contact resistance is capable of being further decreased, the thickness of the Ti film 11c is preferably approximately 30 Å or more.

In the above preferred embodiment, on the primary surface of the piezoelectric substrate made of a $LiTaO_3$ material, epitaxial films of Ti, AlCu, and Ti having thicknesses of about 120 Å, about 1,500 Å, and about 50 Å, respectively, are formed in this order from a piezoelectric substrate side, thus forming the first electrode. Furthermore, on the first electrode, a Ti film having a thickness of approximately 400 Å and an AlCu film having a thickness of approximately 26,000 Å are formed in this order, thus forming the second electrode. When the Ti film 11c of the above preferred embodiment is an epitaxial film, the contact resistance of the contact portion was about 281 mΩ, for example. On the other hand, as a comparative example, when an elastic wave device is formed to have the same structure as that of the above preferred embodiment except that only the Ti film 11c used as the topmost film is a polycrystalline film, the contact resistance of the contact portion was about 294 mΩ, for example. Hence, when the Ti film 11c is an epitaxial film, the contact resistance is further decreased. In addition, as the contact resistance, a resistance in a region of a contact portion having an area of approximately 20 μm×20 μm measured by a four-terminal method was used.

Figure 4:
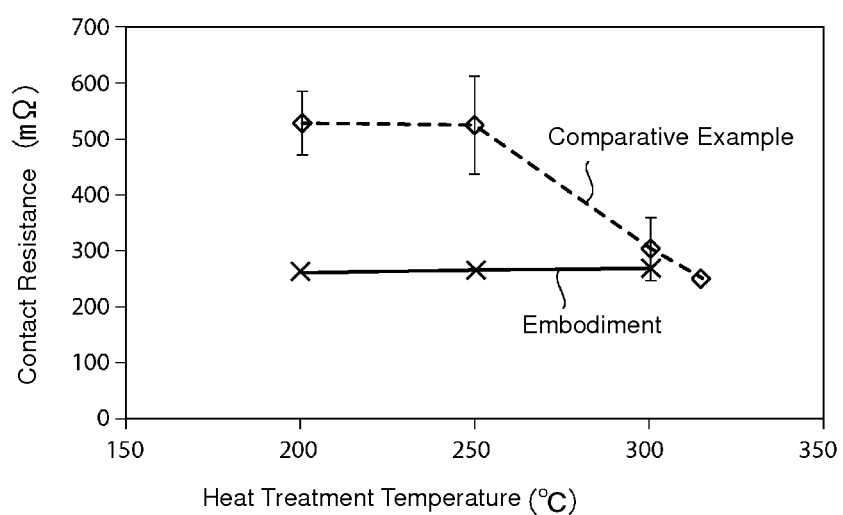
FIG. 4 is a graph showing the relationship between the contact resistance and a heat treatment temperature of the elastic wave device according to a preferred embodiment of the present invention.

A solid line in FIG. 4 represents the relationship between the temperature and the contact resistance of the contact portion of the above preferred embodiment, and a dotted line represents the relationship between the temperature and the contact resistance of a contact portion of an elastic wave device prepared for comparison purpose. In this comparative example, the topmost Ti film 11c is not provided, and the Ti film of the second electrode is directly laminated on the AlCu film.

It was discovered that although the contact resistance is high at a temperature of approximately 300° C. or less according to the dotted line in FIG. 4, in the case in which the Ti films are in contact with each other as in the above preferred embodiment, regardless of the temperature, the contact resistance is low, such as approximately 250 mΩ and is approximately constant. Hence, in the above comparative example, although the contact resistance is decreased by treating at a high temperature of approximately 300° C. or more, if the heat treatment is performed at a temperature lower than approximately 300° C., the contact resistance cannot be decreased. On the other hand, in the above preferred embodiment, even if a heat treatment is performed at a temperature of approximately 300° C. or less, such as approximately 200° C., the contact resistance is sufficiently decreased.

On the other hand, when the AlCu epitaxial film is exposed to a heat treatment at a temperature of more than approximately 300° C., Cu in a twin crystal lattice is aggregated, and Cu hillocks are disadvantageously formed.

Hence, in this preferred embodiment, since the contact resistance is decreased by a heat treatment at a low temperature as described above, the generation of Cu hillocks in the AlCu epitaxial film 11b is effectively reduced or prevented. In particular, when applied to an elastic wave device having a crossover type wire portion 21 which uses an interlayer insulating film 22 shown in FIG. 5, various preferred embodiments of the present invention can be more effectively used. In the crossover type wire portion 21 shown in FIG. 5, the interlayer insulating film 22 is laminated on a lower wire pattern 23. In addition, an upper wire pattern 24 is laminated on the interlayer insulating film 22. The wire pattern 23 and the wire pattern 24 are insulated from each other by the interlayer insulating film 22 provided therebetween. The interlayer insulating film 22 as described above is preferably formed from a thermosetting resin. With the thermosetting resin, a sufficient strength is obtained.

According to this preferred embodiment, when the interlayer insulating film 22 formed from a thermosetting resin is thermally cured, even if a thermosetting temperature is approximately 300° C. or less, the contact resistance between the first electrode 11 and the second electrode 12 is sufficiently decreased. On the other hand, in the above comparative example, when the thermosetting temperature is low, the contact resistance cannot be sufficiently decreased. Furthermore, when a thermal load at approximately 300° C. or more is additionally applied in order to decrease the contact resistance, the Cu hillocks described above are generated.

Hence, according to various preferred embodiments of the present invention, as the thermosetting resin defining the interlayer insulating film 22, a thermosetting resin having a thermosetting temperature of approximately 300° C. or less preferably is used. Accordingly, the generation of Cu hillocks is effectively reduced or prevented. As a result, a thermosetting polyimide resin having a thermosetting temperature of about 220° C. to about 270° C. preferably is used as the thermosetting resin.

Figure 5:
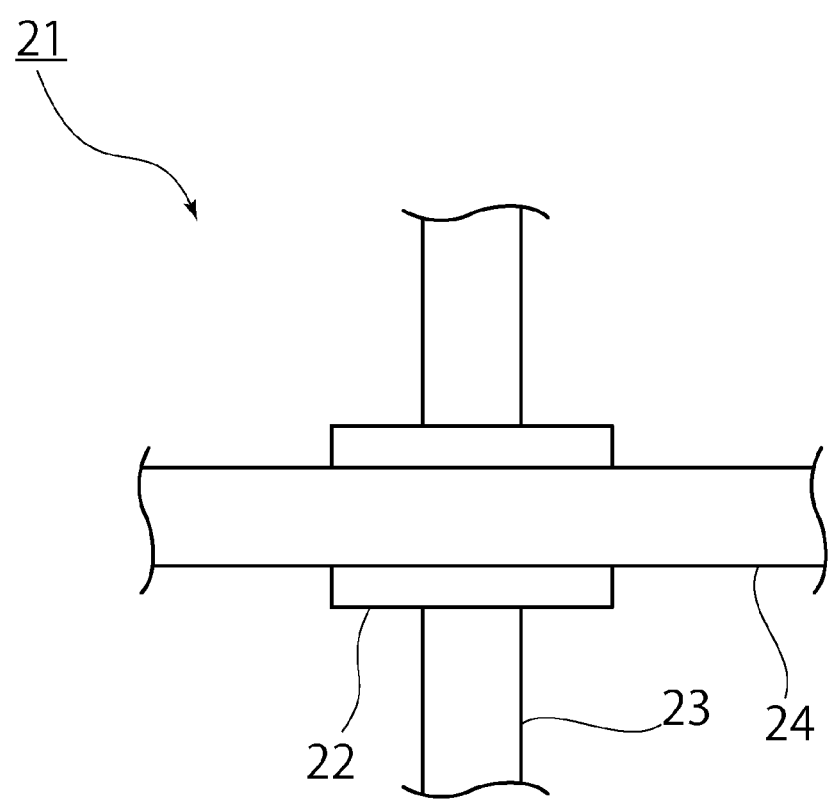
FIG. 5 is a partially cutaway view showing a crossover type wire portion included in an elastic wave device according to another preferred embodiment of the present invention.
Figure 6:
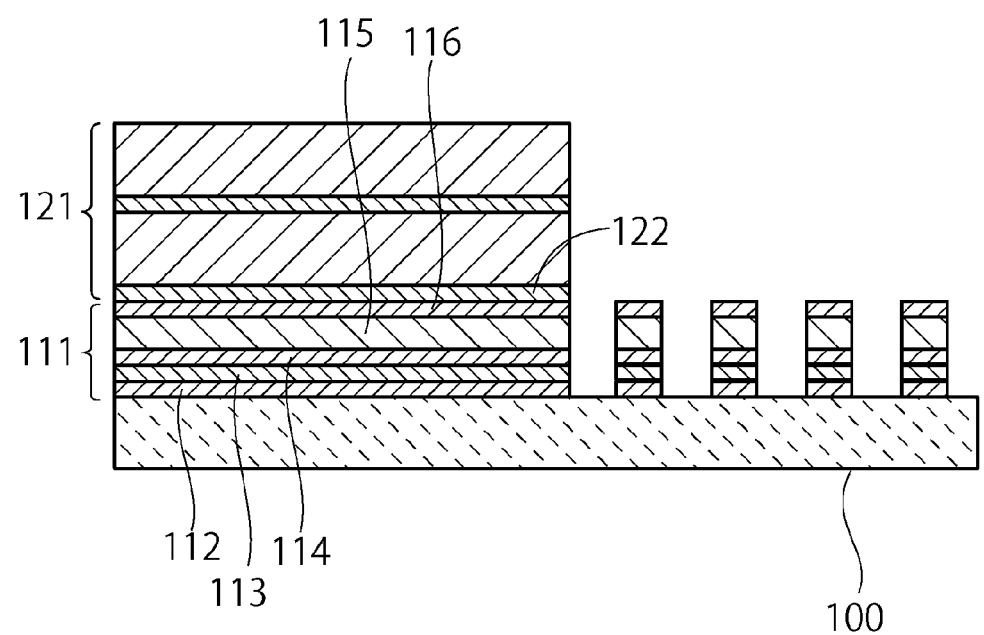
FIG. 6 is a schematic cross-sectional view showing an electrode structure of a related elastic wave device.

In addition, although the crossover type wire portion is described with reference to FIG. 5, various preferred embodiments of the present invention may also be effectively applied to an elastic wave device including another portion formed by thermosetting a thermosetting resin instead of the crossover type wire portion 21. That is, even if the thermosetting temperature of the thermosetting resin is set to approximately 300° C. or less, the contact resistance between the first electrode 11 and the second electrode 12 is capable of being sufficiently decreased, and the generation of Cu hillocks is also be effectively reduced or prevented.

In addition, when the piezoelectric substrate 2 is preferably made of a piezoelectric material having low pyroelectric properties and is exposed to a high temperature of more than approximately 300° C., the pyroelectric properties are liable to be recovered in some cases. In the elastic wave device according to a preferred embodiment of the present invention, since a heat treatment performed at a high temperature of more than approximately 300° C. is not required, the recovery of the pyroelectric properties as described above is also prevented.

Next, a non-limiting example of a method for manufacturing the surface acoustic wave device 1 of the above preferred embodiment will be described.

First, the piezoelectric substrate 2 is prepared. The first electrode 11 including the IDT electrode 3, the electrode pads 13 to 15, and the wire patterns 16 to 18 are formed on the piezoelectric substrate 2 to have a flat or substantially flat shape. More particularly, the Ti film 11a, the AlCu epitaxial film 11b, and the Ti film 11c preferably are formed by a sputtering method, a deposition method, or the like to have a crystal orientation oriented in a predetermined direction so that the normal line direction of the (111) plane of the Al crystal of the AlCu film and the normal line direction of the (001) plane of the Ti crystal of each of the Ti film 11a and the Ti film 11c coincide with the Z axis of the crystal of the piezoelectric substrate 2, and subsequently, patterning is performed. Accordingly, the Ti film 11a, the AlCu epitaxial film 11b, and the Ti film 11c, each of which is an epitaxial film, are obtained. In addition, in this preferred embodiment, the thickness of the Ti film 11a was set to about 12 nm, the thickness of the AlCu epitaxial film 11b was set to about 150 nm, and the thickness of the Ti film 11c was set to about 4 nm, for example. However, the thicknesses of the above films are not limited to the specific thicknesses mentioned above. In this preferred embodiment, the Z axis of the crystal of the piezoelectric body indicates the Z axis which is one crystal axis among the X axis, the Y axis, and the Z axis of a piezoelectric crystal material provided as the initial values of the Euler angles.

In addition, the AlCu epitaxial film 11b was grown as an epitaxial film having a twin structure with a six-fold rotational symmetrical spot appearing in an XRD pole figure. The Cu concentration was set to about 0.2 percent by weight or more.

The Ti film 11a and 11c and the AlCu epitaxial film 11b, which were metal films, were formed by a vacuum deposition method after a mask was laminated on the piezoelectric substrate 2. However, an appropriate metal film forming method, such as a sputtering method, may also be used. As a method for patterning a metal film, for example, a photolithographic method may be used.

Next, the second electrode 12 is formed on the first electrode 11. When the second electrode 12 was formed, the Ti film 12a and the AlCu film 12b were formed in this order. In this preferred embodiment, the thickness of the Ti film 12a and that of the AlCu film 12b were set to about 10 nm and about 400 nm, respectively.

In addition, the thicknesses of the Ti film 12a and the AlCu film 12b are not limited to those mentioned above. Methods for forming the Ti film 12a and the AlCu film 12b are not particularly limited, and for example, a sputtering method or a vacuum deposition method may be appropriately used.

Next, in order to decrease the contact resistance of the contact portion between the first electrode 11 and the second electrode 12, the whole surface acoustic wave device 1 was heated for 2 hours at a temperature of approximately 270° C. The contact resistance is decreased as described above. That is, the contact resistance of the contact portion is decreased by the heat treatment described above.

In the manufacturing method of this preferred embodiment, the individual steps described above each preferably is performed at a temperature of approximately 300° C. or less. Hence, the generation of Cu hillocks is significantly reduced or prevented.

In addition, when the surface acoustic wave device 1 is actually manufactured, for example, external connection terminals, such as bumps, are formed, and a protective film is formed using an insulating film. In the case as described above, those additional steps are also preferably performed at a temperature of approximately 300° C. or less. Accordingly, a piezoelectric material having low pyroelectric properties preferably is used as the piezoelectric substrate, and the pyroelectric properties thereof are prevented from being recovered at a high temperature. In addition, the generation of Cu hillocks is also significantly reduced or prevented.

In the preferred embodiment described above, the first electrode 11 preferably has a multilayer structure including the Ti film 11a, the AlCu epitaxial film 11b, and the Ti film 11c provided in this order from the bottom. Instead of using the AlCu epitaxial film 11b, an epitaxial film made of a different metal may also be used. In particular, instead of using the AlCu epitaxial film 11b, an Al epitaxial film or a Pt epitaxial film may also be used. Furthermore, as long as the topmost film is the Ti film 11c, the multilayer structure of the first electrode 11 is not particularly limited. That is, the bottom Ti film 11a may not be provided. Furthermore, another epitaxial metal film may be provided between the AlCu epitaxial film 11b and the Ti film 11c.

The second electrode 12 is not particularly limited as long as the bottommost film is the Ti film 12a. That is, a metal film other than the AlCu film 12b may be laminated on the Ti film functioning as the bottommost film of the second electrode 12, or another metal film may be further laminated on the AlCu film 12b. In addition, the AlCu film 12b is not required to be an epitaxial film.

In addition, in various preferred embodiments of the present invention, the first electrode and the second electrode are laminated on the piezoelectric substrate, and the functional portions of the elastic wave device including the IDT electrode are not particularly limited. Hence, various types of filters and resonators may be provided in accordance with various preferred embodiments of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate including a primary surface;
   a first electrode provided on the primary surface of the piezoelectric substrate and including a first multilayer metal film including at least three metal films laminated in a bottom-to-top direction, and at least an IDT electrode;
   a second electrode provided above the primary surface of the piezoelectric substrate and including a second multilayer metal film including metal films laminated in the bottom-to-top direction; and
   a contact portion at which the first electrode and the second electrode are electrically connected to each other and defined by a portion at which a bottommost film of the second multilayer metal film and a topmost film of the first multilayer metal film are overlapped with each other; wherein
   the first multilayer metal film includes an epitaxial Ti film defining the topmost film and an epitaxial AlCu film, the epitaxial Ti film having a crystal orientation oriented in a predetermined direction so that a normal line direction of a (001) plane of a Ti crystal of the epitaxial Ti film coincides with a Z axis of a crystal of a piezoelectric body defining the piezoelectric substrate; and
   the second multilayer metal film includes a Ti film as the bottommost film.

2. The elastic wave device according to claim 1, wherein the Ti film defining the bottommost film of the second multilayer metal film is a polycrystalline Ti film;

the second multilayer metal film includes an Al film provided on the bottommost film; and the epitaxial Ti film which is the topmost film of the first multilayer metal film and the polycrystalline Ti film which is the bottommost film of the second multilayer metal film define an interlayer Ti—Ti junction layer.

3. The elastic wave device according to claim 1, wherein a Cu concentration of the epitaxial AlCu film is 0.2 percent by weight or more.

4. The elastic wave device according to claim 3, wherein the Cu concentration of the epitaxial AlCu film is 10 percent by weight or less.

5. The elastic wave device according to claim 4, wherein a thickness of the epitaxial Ti film defining the topmost film of the first multilayer metal film is about 30 Å or more.

6. The elastic wave device according to claim 5, wherein the thickness of the epitaxial Ti film defining the topmost film of the first multilayer metal film is about 40 Å or less.

7. The elastic wave device according to claim 1, wherein the first multilayer metal film includes a Ti film, the epitaxial AlCu film, and the epitaxial Ti film defining the topmost film laminated in this order from bottom.

8. The elastic wave device according to claim 1, wherein the second multilayer metal film includes the Ti film defining the bottommost film and an AlCu film laminated in this order from bottom.

\* \* \* \* \*